US007683397B2

(12) United States Patent
Sarid et al.

(10) Patent No.: US 7,683,397 B2
(45) Date of Patent: Mar. 23, 2010

(54) SEMI-PLANAR AVALANCHE PHOTODIODE

(75) Inventors: Gadi Sarid, Tel Aviv (IL); Yimin Kang, San Jose, CA (US); Alexandre Pauchard, Châtel-St-Denis (CH)

(73) Assignee: Intel Corporation, Santa Clara, CA (US)

( * ) Notice: Subject to any disclaimer, the term of this patent is extended or adjusted under 35 U.S.C. 154(b) by 95 days.

(21) Appl. No.: 11/490,994

(22) Filed: Jul. 20, 2006

(65) Prior Publication Data

US 2008/0017883 A1    Jan. 24, 2008

(51) Int. Cl.
H01L 31/0336 (2006.01)
(52) U.S. Cl. ............... 257/186; 257/200; 257/E29.081; 257/E29.085; 257/E31.005
(58) Field of Classification Search ................. 257/184, 257/186, 200, E29.081, E29.085, E31.011, 257/E31.005
See application file for complete search history.

(56) References Cited

U.S. PATENT DOCUMENTS

| | | | |
|---|---|---|---|
| 3,324,297 A | 6/1967 | Heijne | |
| 4,009,058 A | 2/1977 | Mills | |
| 4,212,019 A | 7/1980 | Wataze et al. | |
| 4,786,573 A | 11/1988 | Amada et al. | |
| 5,157,473 A | 10/1992 | Okazaki | |
| 5,233,209 A | 8/1993 | Rodgers et al. | |
| 5,280,189 A | 1/1994 | Schuppert et al. | |
| 5,401,952 A | 3/1995 | Sugawa | |
| 5,420,634 A | 5/1995 | Matsumoto | |
| 5,596,186 A | 1/1997 | Kobayashi | |
| 5,654,578 A | 8/1997 | Watanabe | |
| 5,757,057 A | 5/1998 | Dabrowski | |
| 5,897,371 A | 4/1999 | Yeh et al. | |
| 6,074,892 A | * 6/2000 | Bowers et al. | ................ 438/57 |

(Continued)

FOREIGN PATENT DOCUMENTS

CN    1327272    12/2001

(Continued)

OTHER PUBLICATIONS

Lee et al. "Ion-Implanted Planar-Mesa IMPATT Diodes for Millimeter Wavelengths." Jun. 1978. IEEE Transactions on Electron Devices, vol. ed-25, No. 6, pp. 714-722.*

(Continued)

Primary Examiner—Minh-Loan T Tran
Assistant Examiner—W. Wendy Kuo
(74) Attorney, Agent, or Firm—Blakely, Sokoloff, Taylor & Zafman LLP

(57) ABSTRACT

An avalanche photodetector is disclosed. An apparatus according to aspects of the present invention includes a mesa structure defined in a first type of semiconductor. The first type of semiconductor material includes an absorption region optically coupled to receive and absorb an optical beam. The apparatus also includes a planar region proximate to and separate from the mesa structure and defined in a second type of semiconductor material. The planar region includes a multiplication region including a p doped region adjoining an n doped region to create a high electric field in the multiplication region. The high electric field is to multiply charge carriers photo-generated in response to the absorption of the optical beam received in the mesa structure.

6 Claims, 2 Drawing Sheets

U.S. PATENT DOCUMENTS

| | | | |
|---|---|---|---|
| 6,104,047 | A | 8/2000 | Watanabe |
| 6,130,441 | A * | 10/2000 | Bowers et al. ............... 257/15 |
| 6,384,462 | B1 | 5/2002 | Pauchard et al. |
| 6,459,107 | B2 | 10/2002 | Sugiyama et al. |
| 6,465,803 | B1 | 10/2002 | Bowers et al. |
| 6,492,239 | B2 | 12/2002 | Yang et al. |
| 6,515,315 | B1 | 2/2003 | Itzler et al. |
| 6,632,028 | B1 | 10/2003 | Yang et al. |
| 6,635,908 | B2 * | 10/2003 | Tanaka et al. ............... 257/186 |
| 6,693,308 | B2 * | 2/2004 | Sankin et al. ............... 257/103 |
| 6,759,675 | B2 | 7/2004 | Csutak et al. |
| 6,797,581 | B2 | 9/2004 | Vickers |
| 6,831,265 | B2 | 12/2004 | Yoneda et al. |
| 6,858,463 | B2 | 2/2005 | Bond |
| 6,858,912 | B2 | 2/2005 | Marshall et al. |
| 6,963,089 | B2 | 11/2005 | Shi et al. |
| 7,072,557 | B2 | 7/2006 | Nagarajan et al. |
| 7,082,248 | B1 | 7/2006 | Morse |
| 7,122,734 | B2 | 10/2006 | Fetzer et al. |
| 7,160,753 | B2 | 1/2007 | Williams, Jr. |
| 7,271,405 | B2 * | 9/2007 | Krishna et al. ............... 257/21 |
| 7,348,608 | B2 | 3/2008 | Ko et al. |
| 2001/0035540 | A1 | 11/2001 | Sugiyama et al. |
| 2002/0195616 | A1 | 12/2002 | Bond |
| 2003/0165314 | A1 | 9/2003 | Nagarajan et al. |
| 2004/0251483 | A1 | 12/2004 | Ko et al. |
| 2005/0006678 | A1 | 1/2005 | Tanaka et al. |
| 2005/0051861 | A1 * | 3/2005 | Shi et al. ............... 257/438 |

FOREIGN PATENT DOCUMENTS

| | | | |
|---|---|---|---|
| EP | 0 709 901 A1 | 5/1996 | |
| GB | 2 025 693 A | 1/1980 | |
| GB | 2 054 957 A | 2/1981 | |
| JP | 61-226976 A | 10/1986 | |
| JP | 04-093088 | 3/1992 | |
| KR | 100206079 B1 | 7/1999 | |
| WO | WO 2004/027879 A2 | 4/2004 | |
| WO | PCTUS2007/073320 | 12/2007 | |

OTHER PUBLICATIONS

Temkin, H. et al., "$Ge_{0.6}Si_{0.4}$ rib waveguide avalanche photodetectors for 1.3μm operation", Appl. Phys. Lett. 49 (13), Sep. 29, 1986, pp. 1311-1313.

Liu, Y. et al., "Simple, very low dark current, planar long-wavelength avalanche photodiode", Appl. Phys. Lett. 53 (14), Oct. 3, 1988, pp. 809-811.

Liu, Y. et al., "A Planar InP/InGaAs Avalanche Photodiode with Floating Guard Ring and Double Diffused Junction", Journal of Lightwave Technology, 10 (2), Feb. 1992, pp. 182-193.

Hawking, A.R. et al., "High gain-bandwidth-product silicon heterointerface photodetector", Appl. Phys. Lett. 70 (3), Jan. 20, 1997, pp. 303-305.

Herbert, D.C., "Theory of SiGe Waveguide Avalanche Detectors Operating at λ = 1.3μm", IEEE Transactions on Electron Devices, 45(4), Apr. 1998, pp. 791-796.

Cho, S.R. et al., "Suppression of avalanche gain at the junction periphery by floating guard rings in a planar InGaAs/InGaAsP/InP avalanche photodiodes", CLEO 2000, May 9, 2000, pp. 212-213.

Kang, Y. et al., "Fused InGaAs-Si Avalanche Photodiodes With Low-Noise Performances", IEEE Photonics Technology Letters, 14 (11), Nov. 2002, pp. 1593-1595.

Shi, Jin-Wei et al., "Design and Analysis of Separate-Absorption-Transport-Charge-Multiplication Traveling-Wave Avalanche Photodetectors", Journal of Lightwave Technology, 22 (6), Jun. 2004, pp. 1583-1590.

Temkin, H. et al., "Ge0.6 Si0.4 rib waveguide avalanche photodetectors for 1.3 um operation," Appl. Phys. Lett. 49(13), Sep. 29, 1986, pp. 809-811.

Liu, Y. et al., "Simple, very low dark current, planar long-wavelength avalanche photodiode," Appl. Phys. Lett. 53 (14).

Loudon, A., et al., "Enhancement of the Infrared Detection Efficiency of Silicon Photon-Counting Avalanche Photodiodes By Use of Silicon Germanium Absorbing Layers," Optics Letter, vol. 27, No. 4, Feb. 15, 2002, pp. 219-221.

Herbert, D.C., "Impact Ionisation and Noise in SiGe Multiquantum Well Structures," Electronics Letter, vol. 32, No. 17, Aug. 15, 1996, pp. 1616-1618.

Pauchard, A., et al., "High-Performance InGaAs-on-Silicon Avalanche Photodiodes," Wednesday Afternoon, OFC 2002, pp. 345-346.

Mikawa et al., "Germanium Reachthrough Avalanche Photodiodes for Optical Communication systems at 1.55 um Wavelength Region." IEEE Transactions on Electrical Devices. vol. ED-1, No. 7, Jul. 1984.

Mikami et al. "Improved Germanium Avalanche Photodiodes." IEEE Journal of Quantum Electronics. vol. QE-16, No. 9, Sep. 1980.

Yoshimoto, T. et al., "SOI Waveguide GeSi Avalanche PIN Photodetector at 1.3um Wavelength," IEICE Trans. Electron, vol. E81-C, No. 10, Oct. 1998, pp. 1667-1669.

Sugiyama, M. et al., "A 1.3um Operations Si-Based Planar P-I-N Photodiode with Ge Absorption Layer Using Strain-Relaxing Selective Epitaxial Growth Technology," Extended Abstracts of the International Conference on Solid State Devices and Materials, Japan Society of Applied Physics, Sep. 1998, pp. 384-385.

Kesau, V.P. et al., "Integrated Waveguide-Photodetector Using Si/SiGe Multiple Quantum wells for Long Wavelength Applications," Conference Article, Dec. 9, 1990, pp. 637-640.

PCT/US2006/016646, PCT International Search Report and Written Opinion, Sep. 1, 2006.

Nie, H., et al, "Resonant-Cavity Separate Absorption, Charge and Multiplication Avalanche Photodiodes With High-Speed and High Gain-Bandwidth Product," IEEE Photonics Technology Letters, Vo. 10, No. 3, Mar. 1998, pp. 409-411.

Lenox, C., et al., "Resonant-Cavity InGaAs-InAlAs Avalanche Photodiodes with Gain Bandwidth Product of 290 GHz," IEEE Photonics Technology Letters, vol. 11, No. 9, Sep. 1999, pp. 1162-1164.

Das, N.R., et al., "On the Frequency Response of a Resonant-Cavity-Enhanced Separate Absorption, Grading, Charge, and Multiplication Avalanche Photodiode," Journal of Applied Physics, vol. 92, No. 12, Dec. 15, 2002, pp. 7133-7145.

Emsley, M.K, et al., "High-Speed Resonant-Cavity-Enhanced Silicon Photodetectors on Reflecting Silicon-On-Insulator Substrates," IEEE Photonics Technology Letters, vol. 14, No. 4, Apr. 2002, pp. 1583-1590.

Dosunmu, O.I., et al., "High-Speed Resonant Cavity Enhanced Ge Photodetectors on Reflecting Si Substrates for 1550-nm Operation," IEEE Photonics Technology Letters, vol. 17, No. 1, Jan. 2005, pp. 175-177.

Ru, Y. et al., "The Properties of Epitaxial Pure Germanium Films on Silicon Substrate." IEEE 2001, pp. 634-636.

Li, N. et al., "InGaAs/InAlAs Avalanche Photodiode with Undepleted Absorber," Applied Physics Letters, vol. 82, No. 13,Mar. 31, 2003, pp. 2175-2177.

Zheng, L. et al., "Demonstration of High-Speed Staggered Lineup GaAsSb-InP Unitraveling Carrier Photodiodes," IEEE Photonics Technology Letters, vol. 17, No. 3, Mar. 2005, pp. 651-653.

Office Action mailed Oct. 6, 2006, U.S. Appl. No. 11/170,556, filed Jun. 28, 2005, "Germanium/Silicon Avalanche Photodetector With Separate Absorption and Multiplication Regions."

Office Action mailed Oct. 13, 2005, U.S. Appl. No. 11/121,511, filed May 3, 2005, "Semiconductor Waveguide-Based Avalanche Photodetector With Separate Absorption and Multiplication Regions."

Office Action mailed Feb. 1, 2006, U.S. Appl. No. 11/121,511, filed May 3, 2005, "Semiconductor Waveguide-Based Avalanche Photodetector With Separate Absorption and Multiplication Regions."

Office Action mailed Apr. 14, 2006, U.S. Appl. No. 11/121,511, filed May 3, 2005, "Semiconductor Waveguide-Based Avalanche Photodetector With Separate Absorption and Multiplication Regions."

Office Action mailed Jul. 6, 2006, U.S. Appl. No. 11/121,511, filed May 3, 2005, "Semiconductor Waveguide-Based Avalanche Photodetector With Separate Absorption and Multiplication Regions."

Office Action mailed May 30, 2008, U.S. Appl. No. 11/322,514, filed Dec. 30, 2005, "Avalanche Phtodetector With Reflector—Based Responsibity Enhancement."

Emsley, M. et al., "High-Speed Resonant-Cavity-Enhanced Silicon Photodetectors on Reflecting Silicon-On-Insulator Substrates," IEEE Photonics Technology Letters, vol. 14, No. 4, Apr. 2002, pp. 519-521.

Office Action mailed Dec. 12, 2008, U.S. Appl. No. 11/724,805, filed Mar. 15, 2007.

Office Action mailed Nov. 23, 2005, U.S. Appl. No. 11/243,325, filed Oct. 4, 2005.

Office Action mailed Dec. 24, 2008, U.S. Appl. No. 11/322,514, filed Dec. 30, 2005.

Office Action mailed Dec. 18, 2008, U.S. Appl. No. 11/488,311, filed Jul. 17, 2006.

First Chinese Office Action, Chinese Application No. 200610151347.1, filed Jun. 28, 2006.

Second Chinese Office Action, Chinese Application No. 200610151347.1, filed Jun. 28, 2006.

PCT/US2006/026214—International Search Report and Written Opinion, dated May 4, 2007.

PCT/US2006/026214—International Preliminary Report on Patentability and Written Opinion, dated Jan. 9, 2008.

PCT/US2007/072879—International Search Report and Written Opinion, dated Nov. 29, 2007.

PCT/US2007/072879—International Preliminary Report on Patentability, dated Jan. 20, 2009.

PCT/US2007/072879—Written Opinion, dated Nov. 29, 2007.

PCT/US2007/073320—International Preliminary Report on Patentability and Written Opinion, dated Jan. 20, 2009.

PCT/US2006/016646—International Preliminary Report on Patentability and Written Opinion, dated Nov. 6, 2007.

Korean Preliminary Rejection, Korean Patent Application No. 10-2007-7030930, filed Jun. 28, 2006.

Third Chinese Office Action, Chinese Application No. 200610151347.1, filed Jun. 28, 2006.

European Office Action dated May 2, 2008, European Application No. 06758860.8, filed Apr. 28, 2006.

First Chinese Office Action, Chinese Application No. 200610077681.7, filed Apr. 28, 2006.

Second Chinese Office Action, Chinese Application No. 200610077681.7, filed Apr. 28, 2006.

Green, M.A., et al., "Progress and outlook for high-efficiency crystalline silicon solar cells", Solar Energy Materials & Solar Cells, 2001, vol. 65, pp. 9-16.

* cited by examiner

SEMI-PLANAR AVALANCHE PHOTODIODE

BACKGROUND OF THE INVENTION

1. Field of the Invention

Embodiments of invention relate generally to optical devices and, more specifically but not exclusively relate to photodetectors.

2. Background Information

The need for fast and efficient optical-based technologies is increasing as Internet data traffic growth rate is overtaking voice traffic pushing the need for fiber optical communications. Transmission of multiple optical channels over the same fiber in the dense wavelength-division multiplexing (DWDM) system provides a simple way to use the unprecedented capacity (signal bandwidth) offered by fiber optics. Commonly used optical components in the system include wavelength division multiplexed (WDM) transmitters and receivers, optical filter such as diffraction gratings, thin-film filters, fiber Bragg gratings, arrayed-waveguide gratings, optical add/drop multiplexers, lasers, optical switches and photodetectors. Photodiodes may be used as photodetectors to detect light by converting incident light into an electrical signal. An electrical circuit may be coupled to the photodetector to receive the electrical signal representing the incident light. The electrical circuit may then process the electrical signal in accordance with the desired application. Avalanche photodetectors provide internal electrical gain and therefore have high sensitivity suitable for very weak optical signal detection.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Methods and apparatuses for semi-planar avalanche photodetectors (APDs) are disclosed. In the following description numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments. In addition, it is appreciated that the figures provided herewith are for explanation purposes to persons ordinarily skilled in the art and that the drawings are not necessarily drawn to scale. Moreover, it is appreciated that the specific example doping concentrations, thicknesses and materials or the like that are described in this disclosure are provided for explanation purposes and that other doping concentrations, thicknesses and materials or the like may also be utilized in accordance with the teachings of the present invention.

Figure 1:
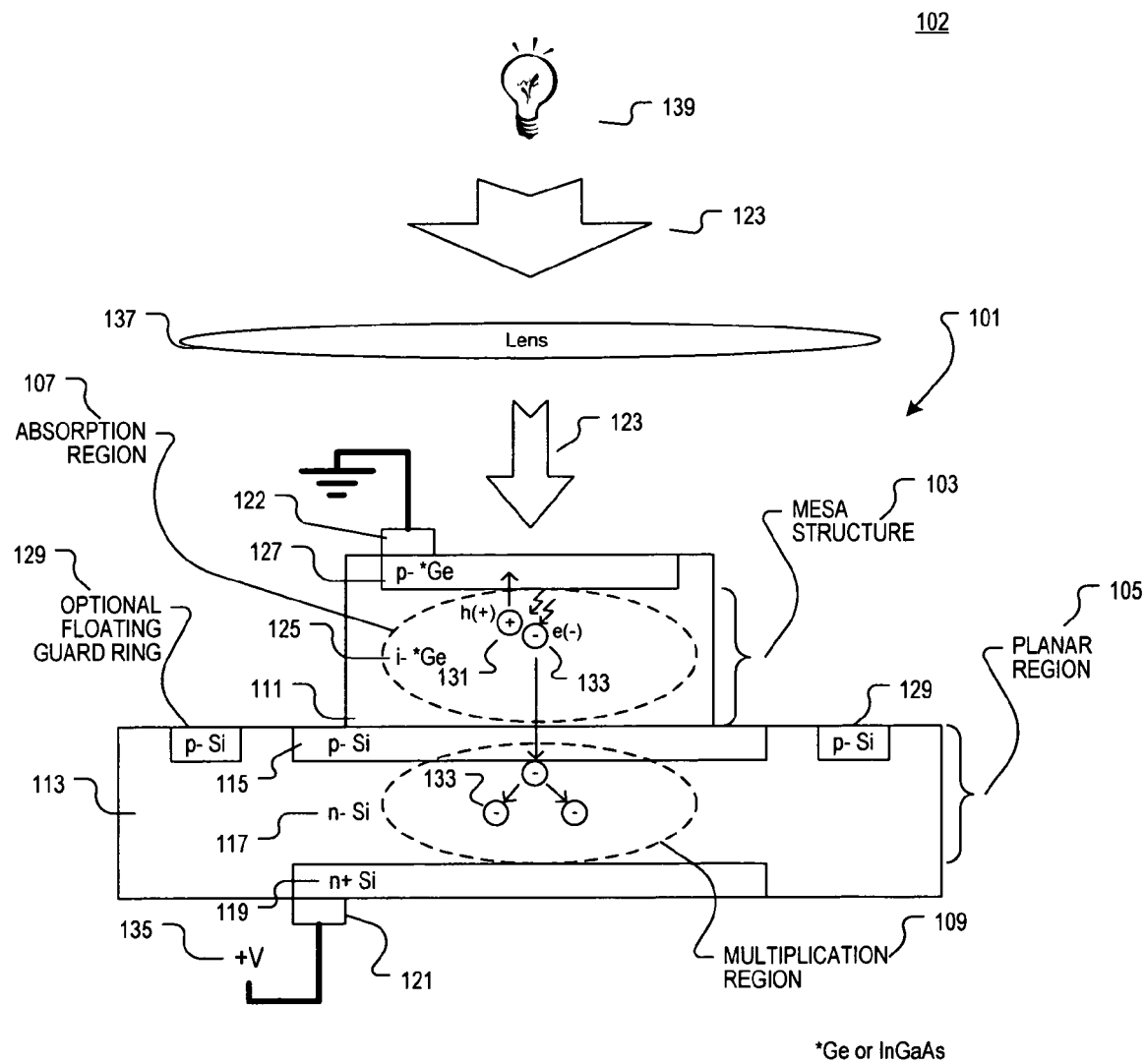
FIG. 1 is a diagram illustrating an example of a cross-section view of a semi-planar avalanche photodetector with a mesa structure having an absorption region disposed over a planar region having a multiplication region in a system in accordance with the teachings of the present invention.

FIG. 1 is a diagram illustrating generally a cross-section view of a system 102 including a semi-planar avalanche photodetector (APD) 101 according to an example of the present invention. In the illustrated example, light or an optical beam 123 is directed from an optical source 139 to APD 101. Depending on the specific application, optical beam 123 may originate from or may be reflected from optical source 139. In one example, optical beam 123 may optionally be directed or focused from optical source 139 directly to APD 101 or may be directed through an optical element 137 to APD 101.

It is appreciated that one or more APDs 101 may be used in a variety of applications and configurations. For instance, depending on the specific application, it is appreciated that APD 101 may be employed individually to for example detect a signal encoded in lower power optical beam 123 in telecommunications. In another example, APD 101 may be one of a plurality of APDs arranged in an array or grid to sense images or the like. For example, an array APD's arranged in a grid may function to sense images, similar to a complementary metal oxide semiconductor (CMOS) sensor array or the like.

In one example, optical element 137 may include a lens or other type of refractive or diffractive optical element such that an image is directed or focused on array of APDs 101 with illumination including optical beam 123. Optical beam 123 may include visible light, infrared light and/or a combination of wavelengths across the visible through infrared spectrum or the like.

In the illustrated example, APD 101 is functionally a combination of a photodiode that converts optical signal into electrical signal and an amplifier that multiplies the detected signal with gain. As shown, APD 101 includes a mesa structure 103 including a first type of semiconductor material 111 proximate to and separated from a planar region 105 including a second type of semiconductor material 113. As shown in the example, mesa structure 103 includes an absorption region and planar region 105 includes a separate multiplication region 109. In the illustrated example, the first type of semiconductor material includes an intrinsic germanium region 125 and the second type of semiconductor material includes a p doped silicon region 115 adjoining an n doped silicon region 117 as shown.

In the example, an external bias voltage V+ 135 may be applied to the APD 101 through a contact 121 coupled to the planar region 105 and a contact 122 coupled to mesa structure 103. In one example, contact 122 is coupled to the mesa structure 103 at a p doped region of the first type of semiconductor material 127 and contact 121 is coupled to the planar region 105 at an n+ doped region of the second type of semiconductor material 119, which help improve the ohmic contact of contacts 121 and 122 to the APD 101 in accordance with the teachings of the present invention.

In the example shown in FIG. 1, it is noted that the n+ doped region 119 is illustrated to be a region confined or centered underneath the mesa structure 103. As will be illustrated in another example shown FIG. 2, it is appreciated that the n+ doped region can also be a uniform layer throughout the planar region 105. For instance, in such an example, the n+ doped region 119 could be a highly n+ doped silicon substrate layer defined in the planar region 105 in accordance with the teachings of the present invention.

Referring back to the example illustrated in FIG. 1, it is noted that the first type of semiconductor material is shown as germanium. It is appreciated that in another example, the first type of semiconductor material may include InGaAs or another suitable type of material in accordance with the teachings of the present invention.

In the example shown in FIG. 1, APD 101 includes two regions in terms of electric field strength—one is in absorption region 107 of mesa structure 103, in which a low electric field is created with the application of the external bias voltage V+ 135 to APD 101. The other electric field region is in the multiplication region 109 of the planar region 105, in which a high electric field is created at the pn junction interface between the p doped silicon region 115 and the n doped silicon region 117 in accordance with the teachings of the present invention.

In operation, free charge carriers or electron-hole pairs are initially photo-generated in the absorption region 107 in mesa structure 103 by the incident photons of optical beam 123 if the photon energy is equal to or higher than the band gap energy of the semiconductor material (e.g. germanium or InGaAs) inside low electric field absorption region 107. These photo-generated charge carriers are illustrated in FIG. 1 as holes 131 and electrons 133.

With the application of the external bias voltage V+ 135 to APD 101 resulting in the low electric field in mesa structure 103, the holes 131 are accelerated towards contact 122 coupled to the mesa structure 103 while the electrons 133 are accelerated towards contact 121 out from the mesa structure 103 into the planar region 105 in accordance with the teachings of the present invention. It is noted that the speed performance of APD 101 is improved by having mesa structure 103 localize the low electric field in the absorption region 107 in accordance with the teachings of the present invention.

Electrons 133 are separated from holes 131 as they injected as a result of the low electric field in the absorption region 107 into the high electric field in multiplication region 109 as a result of the pn junction interface between the p and n doped silicon region 115 and 117. Impact ionization occurs as electrons 133 gain enough kinetic energy and collide with other electrons in the semiconductor material in multiplication region 109 resulting in at least a fraction of the electrons 133 becoming part of a photocurrent. A chain of such impact ionizations leads to carrier multiplication in accordance with the teachings of the present invention. Avalanche multiplication continues to occur until the electrons 133 move out of the active area of the APD 101 to contact 121.

Therefore, with the low electric field absorption region 107 part of the APD 101 included in a mesa structure 103 and with the high electric field multiplication region 109 included in a planar region 105 as shown, a "semi-planar" APD 101 is realized in accordance with the teachings of the present invention. In other words, with the combination of a planar structure for planar region 105 for the silicon portion of APD 101, and a mesa structure 103 for the germanium portion of APD 101, a semi-planar APD 101 is realized.

In the illustrated example, with the combination of a planar structure of the silicon portion and a mesa structure for the germanium or InGaAs portion of APD 101, benefits of having both planar and mesa structures may be realized in accordance with the teachings of the present invention. For example, by having the planar region 105 for the silicon, APD 101 has low dark current, increased reliability and uniform avalanche gain in accordance with the teachings of the present invention. In addition, by having the mesa structure 103 for the germanium or InGaAs, APD 101 has high speed and low crosstalk between any neighboring pixels in arrays of APDs since the low electric field is confined in the mesa structure 103 in accordance with the teachings of the present invention.

In addition, with a semi-planar APD 101, where one material, such as silicon, is included in the multiplication region 109 and another material, such as germanium or InGaAs, is included in the absorption region 107 allows different processing and design techniques that can be optimized for each specific region and/or material in accordance with the teachings of the present invention.

For instance, in one example, germanium may be epitaxially grown using selective growth germanium on tope of the silicon of planar region 105. Mesa structure 103 can then be etched with the etching being stopped at the silicon of planar region 105. By etching the mesa structure 103 and stopping the etching at the silicon, a mesa structure 103 including the absorption region 107 is provided while maintaining planar region 105 with a multiplication region 109 including silicon in accordance with the teachings of the present invention.

Thus, in the specific example illustrated in FIG. 1, a germanium on silicon, or Ge—Si, APD 101 is illustrated where the germanium mesa structure 103 includes the absorption region 107, which has low electric field; while silicon is in the multiplication agent in which high electric field is concentrated under the central p doped region 115. In one example, due to the curvature of the central p doped region 115, the high electric field peaks along the edge of the center p doped region 115.

Figure 2:
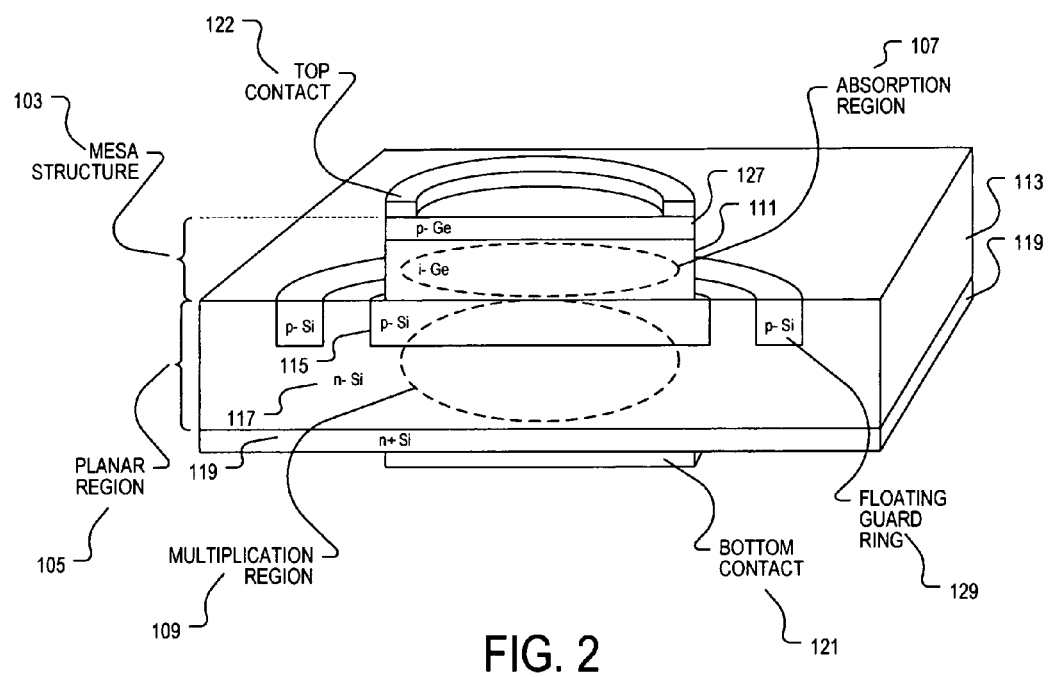
FIG. 2 is a diagram illustrating an example of a tilt view of a cross-section of a semi-planar avalanche photodetector with a mesa structure having an absorption region disposed over a planar region having a multiplication region in a system in accordance with the teachings of the present invention.

FIG. 1 also illustrates an optional guard ring structure 129 that may included in APD 101, which in the example is shown as a floating guard ring having a p doped silicon region disposed in the silicon of planar region 105. FIG. 2 is another diagram illustrating an example of a tilt view of the cross-section of the semi-planar APD 101 shown in FIG. 1 with mesa structure 103 having absorption region 107 disposed over planar region 105 having multiplication region 109 in accordance with the teachings of the present invention. In the example illustrated in FIG. 2, it is noted that the n+ doped region 119 is a uniform highly doped silicon layer throughout the planar region 105, as mentioned previously. As shown the example illustrated in FIG. 2, guard ring structure 129 is a floating guard ring including p doped silicon disposed in the silicon of planar region 105 surrounding the mesa structure 103 in accordance with the teachings of the present invention. Thus, in the example, the guard ring structure 129 is at or proximate to the interface between the absorption region 107 and the multiplication region 109 of APD 101 in accordance with the teachings with the present invention. In the illustrated example, guard ring structure 129 provides the structure to help reduce or prevent premature breakdown in the multiplication region 109 at the device periphery. In one example, guard ring structure 129 may be included using ion implantation, diffusion or another suitable technique.

It is appreciated that a "sandwiched" guard ring structure as illustrated is made possible the semi-planar structure of the APD 101 as such a structure would not be possible with a mesa only device. In addition, it is noted that by having multiplication region 109 in a planar region 105, sensitivity to side walls passivation, which can cause undesired leakage current due to the high electric field in the multiplication region 109 is eliminated in accordance with the teachings of the present invention.

The above description of illustrated embodiments of the invention, including what is described in the Abstract, is not intended to be exhaustive or to be limitation to the precise forms disclosed. While specific embodiments of, and examples for, the invention are described herein for illustrative purposes, various equivalent refinements and modifications are possible, as those skilled in the relevant art will recognize. Indeed, it is appreciated that any specific wavelengths, dimensions, materials, times, voltages, power range values, etc., are provided for explanation purposes and that other values may also be employed in other embodiments in accordance with the teachings of the present invention.

These modifications can be made to embodiments of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation.

What is claimed is:

1. An apparatus, comprising:
   a mesa structure defined in a first type of semiconductor, the first type of semiconductor material including an absorption region optically coupled to receive and absorb an optical beam; and
   a planar region proximate to and separate from the mesa structure and defined in a second type of semiconductor material, the planar region including a multiplication region including a p doped region adjoining an n doped region to create a high electric field in the multiplication region to multiply charge carriers photo-generated in response to the absorption of the optical beam received in the mesa structure,
   wherein the planar region further includes a guard ring structure disposed in the second type of semiconductor material of the planar region surrounding the mesa structure,
   wherein the guard ring structure is a floating guard ring at an interface between the absorption region and the multiplication region.

2. The apparatus of claim 1 wherein the first type of semiconductor comprises germanium and the second type of semiconductor material comprises silicon.

3. The apparatus of claim 1 wherein the first type of semiconductor comprises InGaAs and the second type of semiconductor material comprises silicon.

4. The apparatus of claim 1 wherein the guard ring structure is a floating guard ring including p doped second type of semiconductor material.

5. The apparatus of claim 1 further comprising contacts coupled to the mesa structure and planar regions, respectively, to receive an external bias voltage to create a low electric field in the mesa structure.

6. The apparatus of claim 5 further comprising a p doped region in the mesa structure and a second n doped region in the planar region coupled to the contacts.

* * * * *